United States Patent [19]

Chenoweth et al.

[11] Patent Number: 5,425,838

[45] Date of Patent: Jun. 20, 1995

[54] MICROCHIP STORAGE TAPE AND COVER THEREFOR

[75] Inventors: Dean B. Chenoweth; Timothy B. Zbikowski, both of Eden Prairie

[73] Assignee: Advantek, Inc., Minnetonka, Minn.

[21] Appl. No.: 113,182

[22] Filed: Aug. 30, 1993

Related U.S. Application Data

[60] Division of Ser. No. 954,967, Sep. 30, 1992, Pat. No. 5,265,723, which is a continuation-in-part of Ser. No. 726,748, Jul. 8, 1991, Pat. No. 5,152,393.

[51] Int. Cl.⁶ .............................................. B30B 15/34
[52] U.S. Cl. ............................. 156/583.4; 156/583.8; 156/583.9; 100/93 P; 100/202; 100/208
[58] Field of Search .............. 156/583.8, 583.9, 581, 156/583.1, 583.4; 100/193, 202, 208, 233, 93 P

[56] References Cited

U.S. PATENT DOCUMENTS

| | | | |
|---|---|---|---|
| 3,375,777 | 4/1968 | Techtmann et al. | 156/583.8 X |
| 3,627,611 | 12/1971 | Bonk | 156/581 X |
| 3,629,035 | 12/1971 | Kuroda | 156/581 X |
| 3,859,159 | 1/1975 | Carter et al. | 156/581 |
| 4,142,933 | 3/1979 | Graham | 100/208 X |
| 4,352,709 | 10/1982 | Urai et al. | 156/380.6 |
| 4,421,589 | 12/1983 | Armini et al. | 156/382 |
| 4,451,325 | 5/1984 | Bubenzer | 156/583.1 |
| 4,640,734 | 2/1987 | Roberts et al. | 156/562 |
| 4,650,535 | 3/1987 | Bennett et al. | 156/352 |
| 4,781,953 | 11/1988 | Ball | 428/36.8 |
| 4,792,373 | 12/1988 | Hsei et al. | 156/497 |
| 4,944,979 | 7/1990 | Gagliano et al. | 428/43 |
| 5,076,427 | 12/1991 | Thomson et al. | 206/330 |
| 5,136,827 | 8/1992 | Sawaya | 53/453 |
| 5,152,393 | 10/1992 | Chenoweth | 206/330 |
| 5,266,150 | 11/1993 | Miller | 156/583.4 |

*Primary Examiner*—David A. Simmons
*Assistant Examiner*—J. Sells
*Attorney, Agent, or Firm*—Burd Bartz & Gutenkauf

[57] ABSTRACT

A tape has a plurality of pockets longitudinally spaced with transverse bridges for carrying electronic microchips. Each pocket has a bottom wall having ridges surrounding the center of the pocket. The ridges engage the microchip to center the microchip within the recess and space leads connected to the microchip from the side walls and end walls of the pocket. Support members extending angularly between the ridge ends are adapted to elevate the microchip above the bottom wall of the pocket and space the leads from the bottom wall. A cover is releasably attached to side flanges and bridges of the tape to close the top of the pockets and retain the positions of the microchips in the pockets. A hole in the bottom wall of the tape allows optical readings to verify the position of the microchip. A heat sealing apparatus has movable shoes with ribs and heaters to heat seal side edges of the cover to the side flanges of the tape and middle portions of the cover to the bridges.

9 Claims, 4 Drawing Sheets

MICROCHIP STORAGE TAPE AND COVER THEREFOR

CROSS REFERENCE TO RELATED APPLICATION

This application is a division of application Ser. No. 954,967, filed Sep. 30, 1992, now U.S. Pat. No. 5,265,723. Application Ser. No. 954,967 is a continuation-in-part of U.S. application Ser. No. 726,748, filed Jul. 8, 1991, now U.S. Pat. No. 5,152,393.

FIELD OF THE INVENTION

The invention relates to tapes having pockets for accommodating electronic components, such as microchips. The tapes have ridges that position the electronic components within the pockets. Covers attached to the tapes confine the electronic components to the pockets.

BACKGROUND OF THE INVENTION

Electronic components have been packaged in carrier tapes provided with cavities for receiving the components and covered with foil. G. J. Scholten et al. in U.S. Pat. No. 4,712,676 discloses an example of a carrier tape having cavities for accommodating electronic components. A covering tape secured to the carrier tape encloses the electronic components within the cavities. The covering tape is a hot-adhesive material that is welded by heat to the opposite edges of the carrier tape. Additional tapes for storing electronic components are disclosed by J. F. Ball in U.S. Pat. No. 4,781,953 and J. H. Thomson et al. in U.S. Pat. No. 5,076,427.

SUMMARY OF THE INVENTION

The invention is directed to a carrier tape and cover adapted to carry one or more electronic components, such as microchips, so as to prevent damage to the microchips and the leads thereon and limit movements to and orientation of the microchips relative to the carrier tape. The cover is joined to the top of the carrier tape that cooperates with support members on the carrier tape to minimize movements of the electronic components within pockets relative to the tape. The carrier tape and cover are flexible to allow the tape and cover to be wound on a reel for storage and transport to an assembly site.

The tape is an elongated strip member having a plurality of generally rectangular laterally spaced pockets for accommodating microchips having projecting leads. The pockets are separated from each other along the length of the tape with transverse bridges. The bridges and upright end walls forming the pockets are joined to longitudinal side flanges. A longitudinal row of holes in each flange or in either flange cooperates with drive sprockets to move the tape during microchip loading and unloading procedures. Each pocket has an open top, side walls and end walls joined to a bottom wall. The bottom wall has a pair of upwardly directed inverted V-shaped first ridges that extend parallel to the side walls of the recess. A pair of upwardly directed inverted V-shaped second ridges are located outwardly from and are centered between the first ridges. The second ridges extend parallel to the end walls of the recess. The first and second ridges are engageable with the microchip to retain the microchip within the center portion of the recess. This spaces the leads of the microchip inwardly from the side walls and end walls of the recess. The ridges have inner inclined surfaces that are complimentary to the outer surfaces of the microchip to facilitate positioning of and to hold the microchip within the center portion of the pocket. Each ridge has upwardly and inwardly inclined ends that are angularly disposed relative to the longitudinal axis of the ridge. The inclined ends of the ridges also facilitate placement of the microchip in the storage position within the pocket.

The carrier tape has a plurality of rectangular shaped support members for supporting the microchip in an elevated position in the pocket above the bottom wall. This spaces the leads of the microchip upwardly from the bottom wall of the pocket and the first and second ridges. The support members extend angularly between adjacent ends of the first and second ridges. Each support member has a top wall located above the bottom wall of the pocket. The ridges have top edges that are located above the top walls of the support members. When the microchip is located in the storage position, the microchip is supported on the support portions of the ridges that extend above the support members engaging the outer surfaces of the microchip to retain the microchip within the center portion of the pocket. The leads of the microchip do not engage any structure of the tape thereby protecting the leads from damage. A cover is a plastic sheet member secured to at least the bridges to close the top of the pockets to hold the microchips within the pockets during winding and unwinding of the tape on and off a reel. The cover can also be secured to one or both side flanges of the tape. An example of a tape reel is disclosed by D. B. Chenoweth in U.S. Pat. No. 4,726,534.

Linear continuous heat or pressure sensitive seals join opposite edges of the sheet member to the side flanges of the tape. A single seal can be used to join one edge of the sheet member to a side flange of the tape. A plurality of longitudinal heat seals join separate portions of the sheet member to the bridges to limit in and out movements of the sheet member thereby limiting movements of the microchips located in the pockets. These heat seals are located inwardly of the end ridges in the tape that positions the microchips in the pockets to ensure limited movements of the microchips in the pockets. The bottom wall of the pocket has a hole for detecting the presence of the microchip within the pocket. A light beam can be used to detect whether the pockets contain a microchip before the cover is attached to the tape.

DESCRIPTION OF PREFERRED EMBODIMENT

Figure 1:
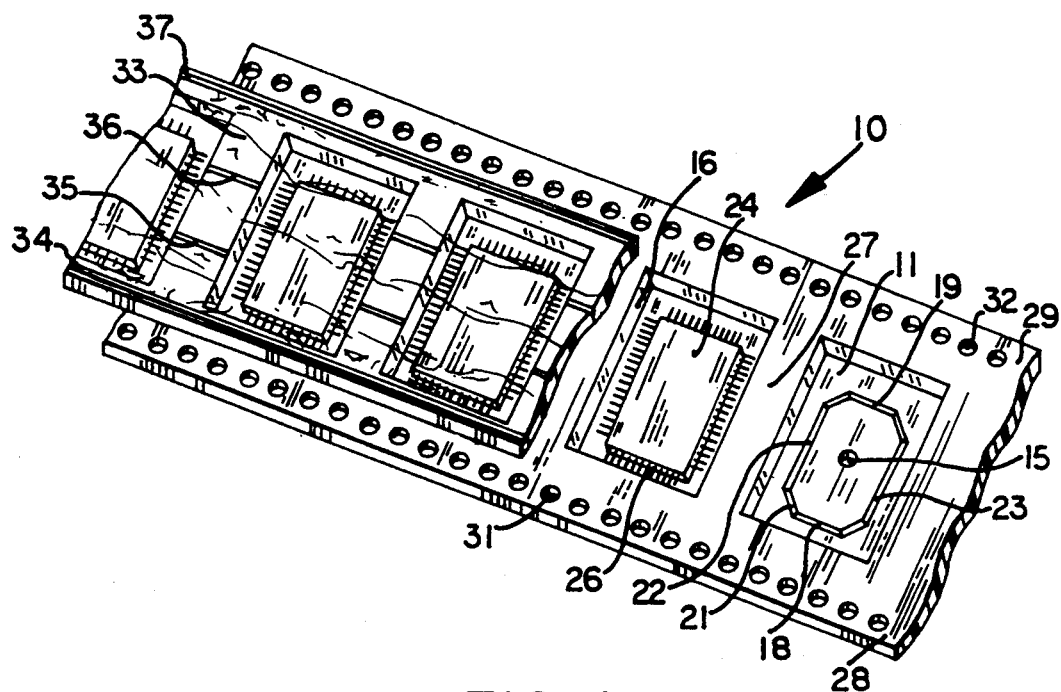
FIG. 1 is a perspective view of the tape accommodating microchips and the cover secured to the top of the tape thereto.
Figure 2:
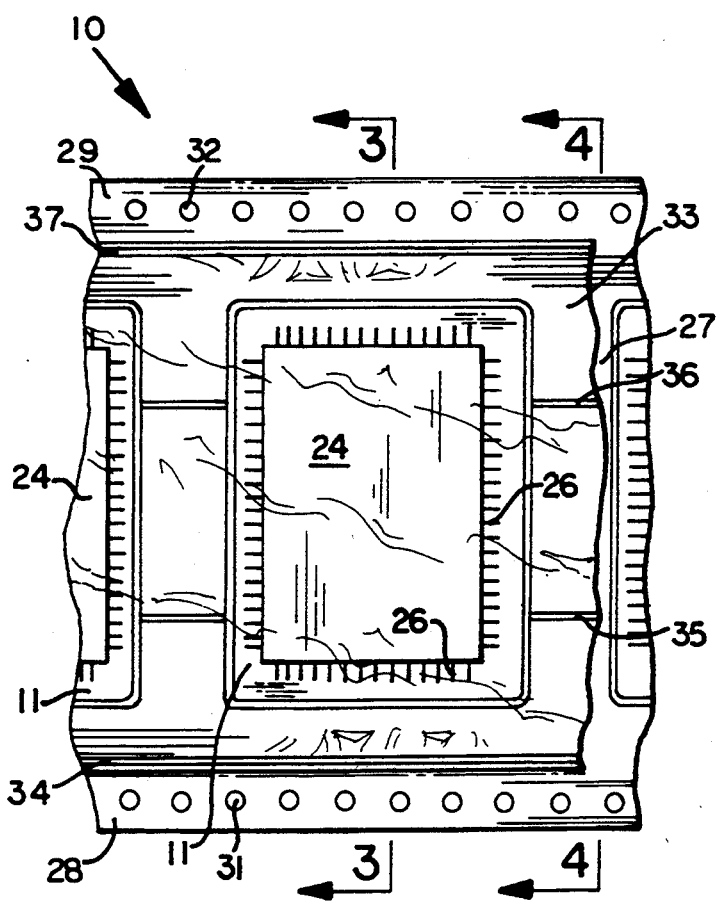
FIG. 2 is an enlarged top plan view of a portion of the tape and cover as shown in FIG. 1.

Referring to FIGS. 1 and 2, there is shown an elongated carrier tape indicated generally at 10 for accommodating electronic parts, shown as microchips having outwardly directed leads. Tape 10 stores the microchip while preventing damage to the leads. Tape 10 is a plastic strip of PVC or polystyrene plastic formed with a plurality of generally rectangular downwardly directed pockets 11. Other types of plastics can be used for tape 10. Each pocket 11 has upright side walls 12 and 13 joined to a bottom wall 14. The center portion of bottom wall 14 has a hole 15. The pockets 11 are completed with transverse walls 16 and 17. The bottom wall 14 has upwardly directed transverse ridges 18 and 19 that are joined to generally horizontal shoulders 21. The shoulders are connected to transverse ribs 22 and 23. The ridges and shoulder support structure for microchip 24 is disclosed in U.S. Pat. No. 5,152,393 incorporated herein by reference.

Figure 3:
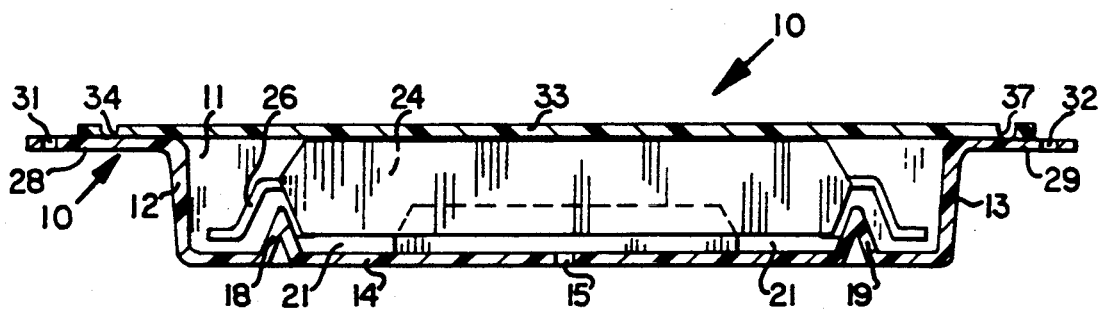
FIG. 3 is an enlarged sectional view taken along the line 3—3 of FIG. 2.

As shown in FIG. 2, microchip 24 has a generally rectangular shape and is positioned within rectangular pocket 11. The outer sides of microchip 24 have outwardly directed leads 26 that are spaced inwardly from upright walls 12, 13, 16 and 17 and above the bottom wall 14 as shown in FIGS. 2 and 3. The corners of microchip 24 rest on shoulders 21 as seen in FIG. 3. Microchips having different shapes can be located in pockets in the tape that conform with shapes of the microchips.

Returning to FIG. 1, tape 11 has a plurality of transverse cross members or bridges 27 that space adjacent pockets 11 along the length of the tape. Bridges 27 have generally flat top surfaces that are coextensive with the top surfaces of the side flanges 28 and 29 that extend along opposite sides along the length of the tape. Side flanges 28 and 29 have a plurality of longitudinally spaced holes 31 and 32 adapted to accommodate drive sprockets and other means used to move the tape relative to component loading and unloading equipment. Also, only one of the side flanges can be provided with longitudinally spaced holes.

Figure 4:
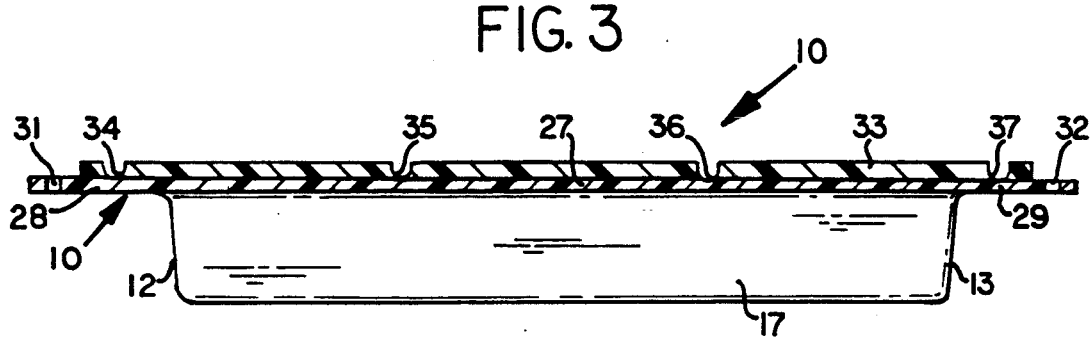
FIG. 4 is an enlarged sectional view taken along the line 4—4 of FIG. 2.

A cover 33 made of static dissipative plastic sheet materials and a heat or pressure sensitive coating is bonded to tape 10 to close pockets 11. As seen in FIGS. 1, 2 and 4, a plurality of longitudinally located heat seals 34, 35, 36 and 37 bond opposite edges of cover 33 to flanges 28 and 29 and bridges 27 located between adjacent pockets 11. Heat seals 34 and 37 are continuous longitudinal seals that bond the opposite side edge portions adjacent outer edges of cover 33 to flanges 28 and 29. A single heat seal can be used to secure one edge portion of cover 33 to a side flange of tape 10. Heat seals 35 and 36 are linear longitudinal seals that bond middle central portions of cover 33 to top of bridges 27. Seals 35 and 36 have at least opposite ends secured to the top of bridges 27 above pocket side walls 16. Seals 35 and 36 are inward of the ridges 18 and 19 in the bottom of pockets 11. Seal 35 is spaced inwardly from edge seal 34. Seal 36 is spaced inwardly from edge seal 37. The seals 35 and 36 are parallel to each other with adjacent seals being laterally spaced from each other. The distances between seals 35 and 36 can vary with the size of tape 10 and cover 33. Seals 35 and 36 extended along longitudinal lines that cross over the microchips in pockets 11. As shown in FIG. 3, cover 33 has minimum clearance space with respect to the top of microchips 24 to prevent escape of microchips 24 from alignment ridges 18, 19, 22 and 23. Heat seals 35 and 36 minimize flexing and in and out movements of cover 33 over pockets 11 thereby controlling the movement of microchip 24 relative to support shoulders 21 and alignment ribs 18, 19, 22 and 23. The confinement of microchip 24 within pocket 11 minimizes damage to the chip leads and improves the integrity of the position of microchip 24 in tape 10.

Figure 5:
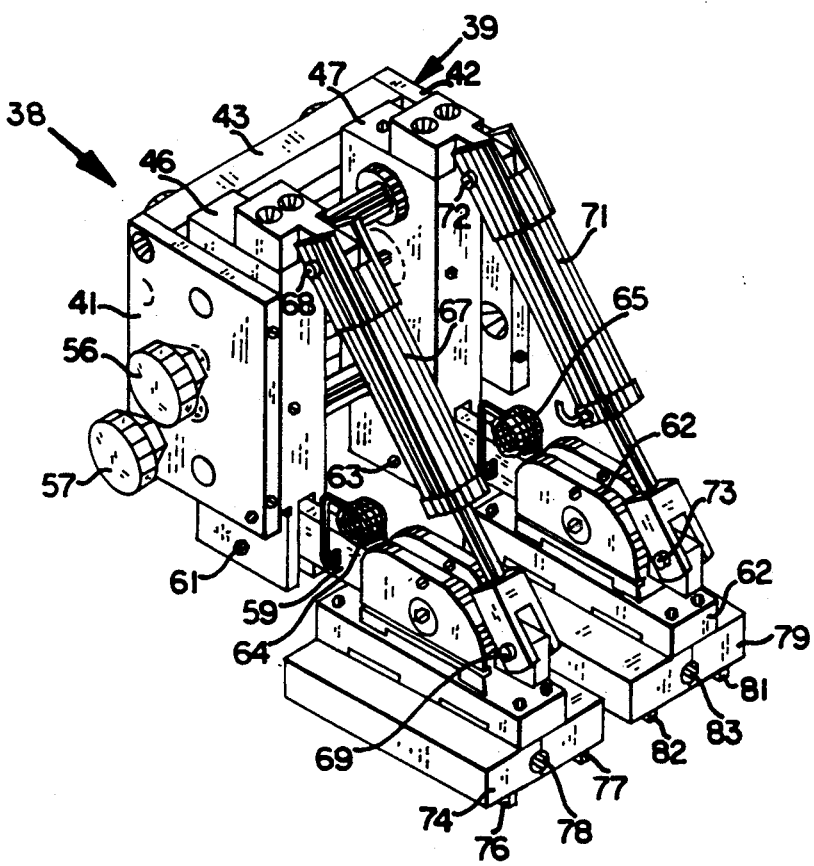
FIG. 5 is a perspective view of the heat sealing apparatus for securing the cover sheet to the tape.
Figure 6:
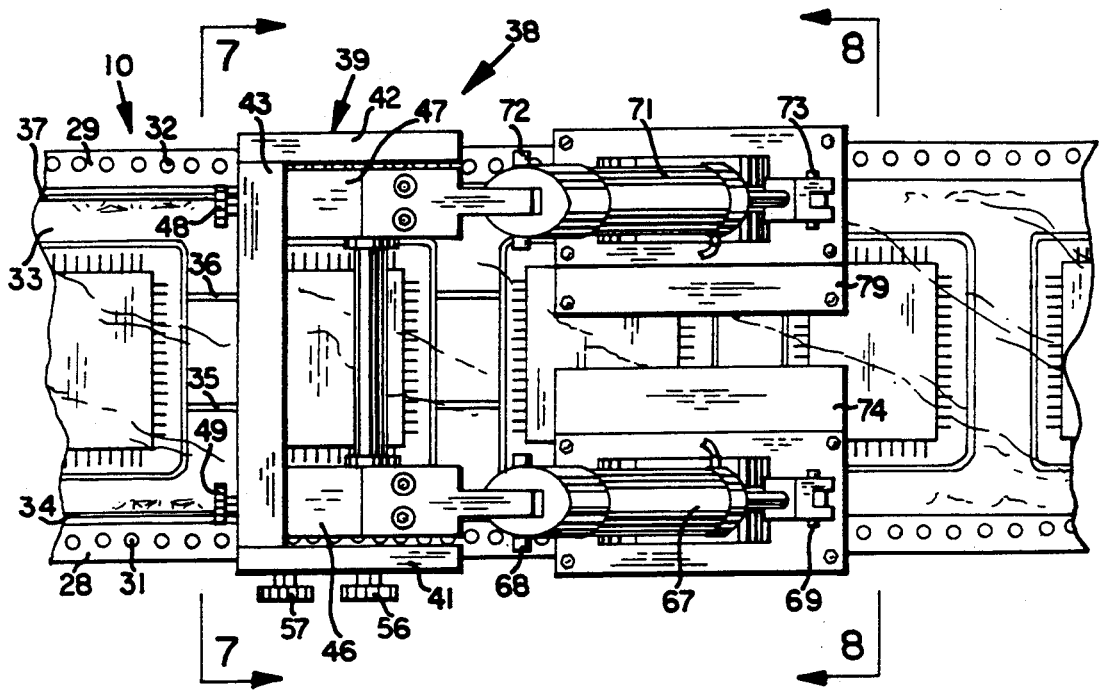
FIG. 6 is a top plan view of the heat sealing apparatus located above the tape and cover accommodating microchips.
Figure 7:
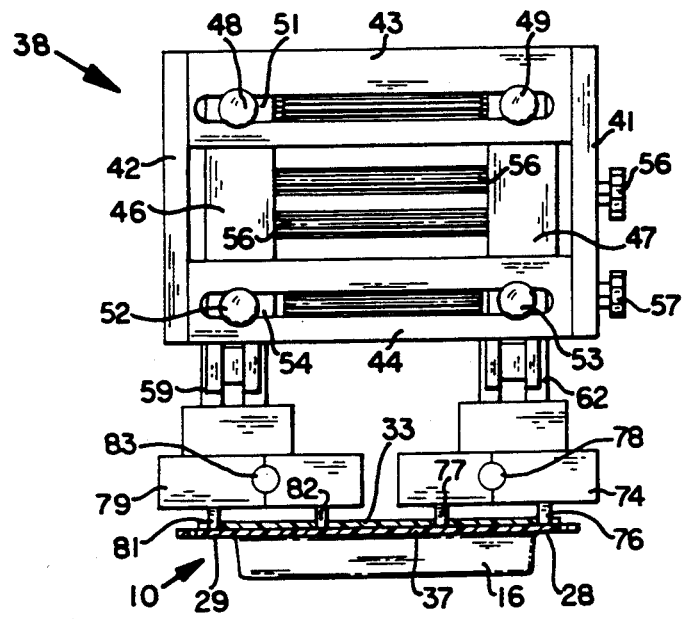
FIG. 7 is a sectional view taken along the line 7—7 of FIG. 6.

Referring to FIGS. 5, 6 and 7, heat sealing apparatus 38 has a generally U-shaped frame indicated generally at 39 mounted on a support (not shown). Frame 39 has a plurality of upright side plates 41 and 42 secured to the rear cross bars 43 and 44. A pair of upright posts 46 and 47 are located adjacent the inside surfaces of side plates 41 and 42. As seen in FIG. 7, a pair of bolts 48 and 49 extend through a transverse horizontal slot 51 in rear bar 43 secures posts 46 and 47 to bar 43. A pair of bolts 52 and 53 extend through a horizontal transverse slot 54 in bar 44 secures the posts 46 and 47 to bar 44. Bolts 48, 49 and 52, 53 can be released to allow posts 46 and 47 to be laterally moved relative to each other whereby the heat sealing apparatus can accommodate different sizes of sheet materials used to cover the pockets on a carrier tape. In other words, heat seal apparatus 38 is adjustable to accommodate different sizes of tapes and cover sheets therefore.

A pair of adjusting screws 56 and 57 rotatably mounted on plate 41 cooperate with threaded members associated with posts 46 and 47 to laterally adjust the posts 46 and 47 relative to each other. Referring to FIGS. 5, 6 and 7, a first arm 59 is connected with pivot member 61 to the bottom of post 46. A second arm 62 is connected to the bottom of post 47 with a pivot member 63. Springs 64 and 66 biased arms 59 and 62 in a downward direction. Pivotal movements of the arms 59 and 62 are controlled by air cylinders 67 and 71 respectively. Air cylinder 67 is connected with a pivot member 68 to the top of post 46 and a pivot member 69 to the outer end of arm 59. Air cylinder 71 is connected with a pivot member 72 to the top of post 47 and a pivot member 73 to the outer end of arm 62. Air cylinders 67 and 71 operate to pivot arms 59 and 62 between up release positions and down or sealing positions.

Figure 8:
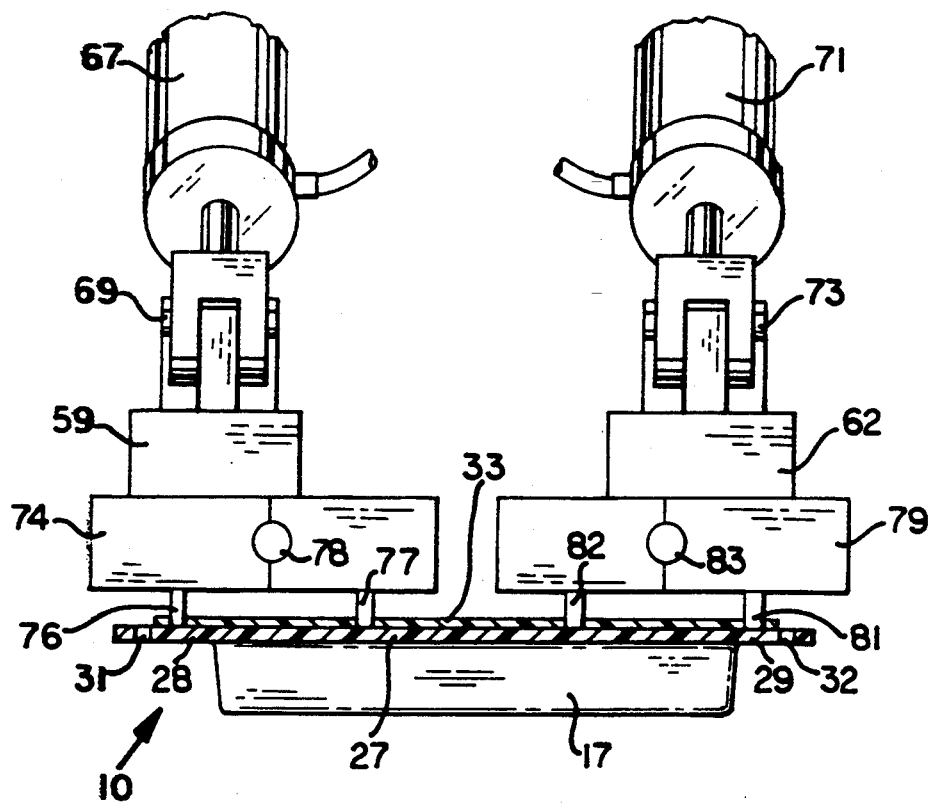
FIG. 8 is a sectional view taken along the line 8—8 of FIG. 6.
Figure 9:
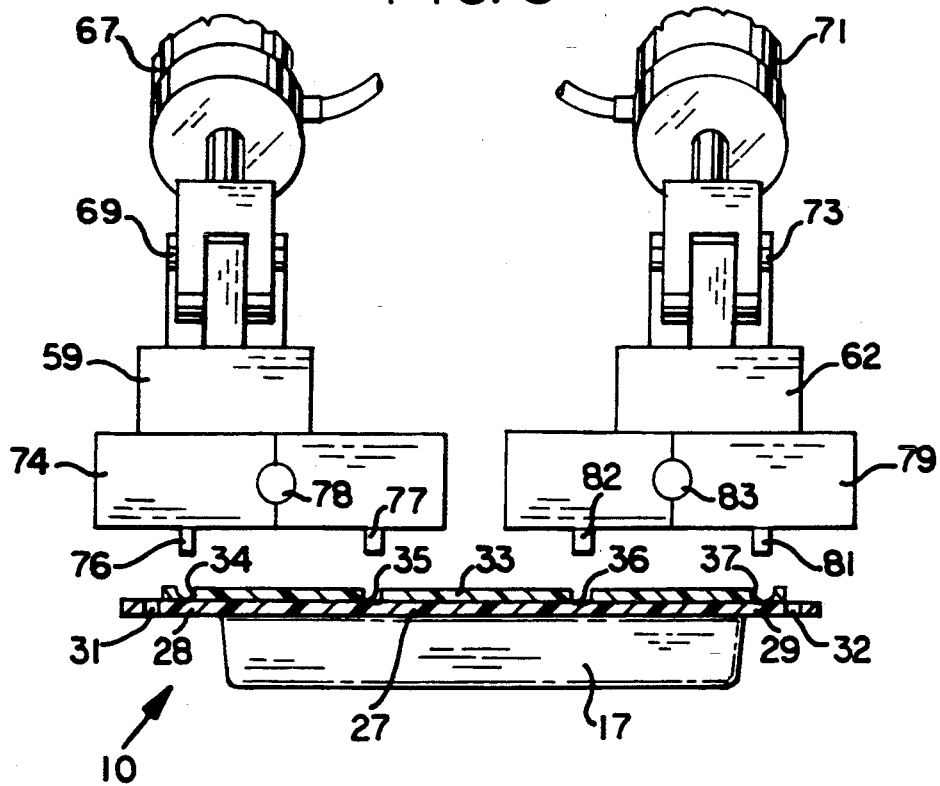
FIG. 9 is a sectional view similar to FIG. 8 with the heat sealing shoes in the release positions.

A generally rectangular shoe 74 is secured to the lower portion of arm 59. Shoe 74 is a two piece metal structure having a pair of laterally spaced longitudinal ribs 76 and 77 that project in a downward direction. A heater 78 extends longitudinally in shoe 74. A second shoe 79 is secured to arm 62. Shoe 79 is a two piece metal structure having a pair of longitudinal laterally spaced ribs 81 and 82. Shoe 79 also supports a longitudinal heater 83. Heaters 78 and 83 are electric operated heating members that are used to supply heat energy to the metal of shoes 74 and 79 and maintain ribs 76, 77 and 81, 82 at selected solid heat sealing temperatures. Shoes 74 and 79 are heat conducting metal members or blocks that serve as heat sinks for the heat energy generated by heaters 78 and 83. The temperature of ribs 76, 77 and 81, 82 is maintained within a selected range sufficient to establish thermo plastic bonding temperature which secures plastic sheet material 33 to the plastic material of tape 10. Air cylinders 67 and 71 exert downwardly directed pressure on shoes 74 and 79 so that the combined pressure and heat effectively bonds sheet member 33 along ribs 76, 77, 81 and 82 to the thermo plastic material of tape 10. The tape 10 rests on a support (not shown) located below shoes 74 and 79. As shown in FIG. 8, air cylinders 67 and 71 have been extended to pivot arms 59 and 62 in a downward direction forcing ribs 76, 77 and 72, 81 in a downward direction into engagement with sheet member 33. The heat dissipated from the ribs 76, 77 and 72, 81 along with the pressure exerted downwardly through ribs 76, 77, 82 and 81 onto sheet member 33 effectively bonds sheet member along the heat seal seams 34, 37 to side flanges 28 and 29 and the top of bridge 27. Seams 34 and 37 are continuous heat seals that join opposite edges of sheet member 33 to the top of side flanges 28 and 29. As seen in FIGS. 8, inner ribs 77 and 82 are laterally inward from side flanges 28 and 29 so that they effectively seal sheet member 33 to the top of bridges 27. Linear portions of sheet member intermediate of edge seals 34 and 37 are thereby sealed to the bridge 27. Seals 35 and 36 are linear and longitudinal heat seals or seams bonding the plastic material of sheet member 33 and tape 10 thereby preventing the middle portions of sheet member 33 from moving relative to the bridges 27. This limits the fluttering or up and down movement of sheet member 33 relative to the pockets and thereby limit the movements of microchips in pockets 11 and maintain the location of the microchips in the pockets.

In use, carrier tape 10 is sequentially moved along a support (not shown) during the loading of the microchips into the pockets. The cover sheet member 33 is superimposed on top of the tape as seen in FIG. 6. The tape 10, along with cover sheet 33, moves along the support under heat sealing apparatus 38. Air cylinders 67 and 81 are sequentially operated to move heat sealing shoes 74 and 79 into operative pressure engagement with cover sheet member 33. The concurrent pressure and heat of ribs 74, 76, 77 and 82 on sheet member 33 resting on the support effectively heat seals sheet member 33 along the seams 34–37 to tape 10. FIG. 8 shows air cylinders 67 and 71 in their retracted positions holding shoes 74 and 79 in release and non-sealing positions to allow tape 10 and cover sheet member 33 to be moved to a second position. The sealing and release positions of shoes 74 and 79 are repeated as tape 10 sequentially moves under heat sealing apparatus 38.

While there has been shown and described a preferred embodiment of the tape with the cover and heat sealing apparatus, it is understood that changes, additions and alterations of the structures may be made by those skilled in the art without departing from the invention. The invention is defined in the following claims.

We claim:

1. An apparatus for securing a heat sealable plastic cover sheet to a plastic carrier tape for confining electronic components on the carrier tape, said carrier tape having a top wall with side flanges and bridges extended between said flanges and pockets between the bridges to accommodate electronic components comprising: a frame, first and second upright posts mounted on the frame, shoe means having first linear longitudinal rib means, and second linear longitudinal rib means for applying pressure and transferring heat to longitudinal portions of the plastic cover sheet located over the top wall of the carrier tape, arm means pivotally mounted on the posts connected to the shoe means, said arm means comprising a first arm pivotally mounted on the first post and a second arm pivotally mounted on the second post, said shoe means comprising a first shoe attached to the first arm and a second shoe attached to the second arm, each shoe having the first linear longitudinal rib means add the second longitudinal rib means, heater means comprising an electric heater mounted on each shoe operable to maintain the shoes and first and second rib means at a heat sealing temperature, power means comprising a first power unit connected to the first arm and first shoe and a second power unit connected to the second arm and second shoe, said power units operable to selectively move the first and second shoes between a first position whereby the first rib means applies pressure and heat to first longitudinal sections of the plastic cover sheet to heat seal the first longitudinal sections of the plastic cover sheet to said side flanges of the tape, and the second rib means applies pressure and heat to second longitudinal sections of the plastic cover sheet to heat seal the second longitudinal sections of the plastic cover sheet to said bridges of the tape to hold the cover sheet against bridges and top wall of the tape and a second position whereby the shoe means and first and second rib means are spaced from the cover sheet, and means mounted on the frame cooperating with the posts for moving the posts laterally relative to each other thereby moving the shoes laterally relative to each other to accommodate tapes and cover sheets having different widths.

2. The apparatus of claim 1 wherein: the first rib means has downwardly directed first ribs for heat sealing opposite edges of the cover sheet to the side flanges of the tape and the second rib means has downwardly directed second ribs for heat sealing middle portions of the cover sheet to the bridges to limit movements of the electronic components in said pockets.

3. The apparatus of claim 1 wherein: each of said first and second shoes has a bore, said heater means including a first heater located in the bore of the first Shoe and a second heater located in the bore of the second shoe.

4. The apparatus of claim 1 wherein: each power unit is an air actuated piston and cylinder assembly.

5. An apparatus for securing a heat sealable plastic cover sheet to a plastic carrier tape for confining electronic components on the carrier tape, said carrier tape having a top wall with side flanges and bridges extended between said flanges and pockets between the bridges to accommodate electronic components comprising: a frame, first and second upright posts mounted on the frame, a first arm pivotally mounted on the first post and a second arm pivotally mounted on the second post, shoe means for applying pressure to the cover sheet located over the top wall of the carrier tape, said shoe means comprising a first shoe attached to the first arm and a second shoe attached to the second arm, each shoe having a first linear longitudinal rib means and a second longitudinal rib means, heater means mounted on each shoe operable to maintain the shoe and first and second rib means at a selected heat sealing temperature, a first power unit connected to the first arm and a first shoe, and a second power unit connected to the second arm and second shoe, said power units operable to selectively move the first and second shoes to a first position whereby the first and second rib means applies pressure and heat to the plastic cover sheet to heat seal the plastic cover sheet to said side flanges of the tape and the second rib means applies pressure and heat to the plastic cover sheet to heat seal the plastic cover sheet to said bridges of the tape to hold the cover sheet against the bridges and top wall of the tape and a second position whereby the shoe means and first and second rib means are spaced from the cover sheet, and means mounted on the frame cooperating with the posts for moving the posts laterally relative to each other thereby moving the shoes laterally relative to each other to accommodate tapes and cover sheet having different widths.

6. The apparatus of claim 5 wherein: the first rib means has downwardly directed first ribs for heat sealing opposite edges of the cover sheet to the side flanges of the tape and said second rib means has downwardly directed second ribs for heat sealing middle portions of the cover sheet to the bridges to limit movements of the electric components in said pockets.

7. The apparatus of claim 6 wherein: the first rib means has a pair of linear longitudinal first ribs and the second rib means has a pair of linear longitudinal second ribs.

8. The apparatus of claim 5 wherein: the shoe means includes bore means, said heater means being located in said bore means.

9. The apparatus of claim 5 wherein: the power units are air actuated pistons and cylinder assemblies.

* * * * *